United States Patent
Wang et al.

(10) Patent No.: US 9,123,691 B2
(45) Date of Patent: Sep. 1, 2015

(54) THIN-FILM TRANSISTOR AND METHOD FOR MANUFACTURING THE SAME

(75) Inventors: Henry Wang, Hsinchu (TW);
 Chia-Chun Yeh, Hsinchu (TW);
 Xue-Hung Tsai, Hsinchu (TW);
 Chih-Hsuan Wang, Hsinchu (TW);
 Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 20 days.

(21) Appl. No.: 13/615,640

(22) Filed: Sep. 14, 2012

(65) Prior Publication Data

US 2013/0187149 A1 Jul. 25, 2013

Related U.S. Application Data

(60) Provisional application No. 61/588,188, filed on Jan. 19, 2012.

(30) Foreign Application Priority Data

May 31, 2012 (TW) .............................. 101119572 A

(51) Int. Cl.
 *H01L 29/417* (2006.01)
 *H01L 29/10* (2006.01)
 *H01L 29/786* (2006.01)
(52) U.S. Cl.
 CPC ...... *H01L 29/41733* (2013.01); *H01L 29/1037* (2013.01); *H01L 29/7869* (2013.01)
(58) Field of Classification Search
 None
 See application file for complete search history.

(56) References Cited

U.S. PATENT DOCUMENTS

| 6,555,420 | B1 | 4/2003 | Yamazaki | |
|---|---|---|---|---|
| 7,619,608 | B2 | 11/2009 | Lee et al. | |
| 2010/0025677 | A1* | 2/2010 | Yamazaki et al. | 257/43 |
| 2010/0193784 | A1* | 8/2010 | Morosawa et al. | 257/43 |
| 2011/0315980 | A1 | 12/2011 | Kim | |
| 2012/0104385 | A1* | 5/2012 | Godo et al. | 257/43 |

FOREIGN PATENT DOCUMENTS

| CN | 1738070 A | 2/2006 |
|---|---|---|
| JP | 2000150906 A | 5/2000 |
| TW | 201203558 A | 1/2012 |

OTHER PUBLICATIONS

Corresponding TW Office Action that these art references were cited.
Corresponding Chinese Office Action that these art references were cited on Apr. 1, 2015.

* cited by examiner

*Primary Examiner* — Whitney T Moore
*Assistant Examiner* — Scott R Wilson
(74) *Attorney, Agent, or Firm* — CKC & Partners Co., Ltd.

(57) ABSTRACT

Disclosed herein is a thin film transistor. The thin film transistor is characterized in having a source interconnect layer and a drain interconnect layer. The source electrode and the drain electrode are respectively disposed above and in contact with the source interconnect layer and the drain interconnect layer. The semiconductor layer is in contact with both the source interconnect layer and the drain interconnect layer, but is not in contact with the source electrode and the drain electrode.

18 Claims, 2 Drawing Sheets

THIN-FILM TRANSISTOR AND METHOD FOR MANUFACTURING THE SAME

CROSS REFERENCE TO RELATED APPLICATIONS

This application claims priority to U.S. Provisional Application Ser. No. 61/588,188 filed Jan. 19, 2012, and Taiwan Application Serial Number 101119572, filed May 31, 2012, the disclosures of which are incorporated herein by reference in their entireties.

BACKGROUND

1. Technical Field

The present invention relates to a thin-film transistor and a method for manufacturing the same.

2. Description of Related Art

Display devices typically include thin film transistors and other electronic elements. In these thin film transistors, amorphous silicon are usually used as the material of the semiconductor layers. In recent years, there has been rapid progress in display technologies, and then metal-oxide semiconductor tends to gradually replace the amorphous silicon in the thin film transistors. Among these metal-oxide semiconductor materials, much attention has been given to indium zinc oxide (IGZO) because it possesses a high mobility.

However, the conventional wet etching process exhibits a low etching selectivity between the IGZO semiconductor layer and the source/drain electrodes made of metallic material such as a molybdenum-chromium alloy. Accordingly, the manufacturing process of IGZO thin film transistors is difficult to be satisfactorily controlled Furthermore, the source/drain electrodes are formed on and in contact with the IGZO semiconductor layer in the conventional IGZO thin film transistors. When a dry etching process is employed to form the source/drain electrodes, ion bombardment possibly damages the back channel of the semiconductor layer, and lead to a degradation of the IGZO semiconductor layer. As a result, the IGZO thin film transistors suffer problems in leakage currents and the shift of threshold voltages after the IGZO thin film transistors are driven for a long time.

Moreover, since the IGZO semiconductor layer is in contact with the metallic source/drain electrodes in conventional IGZO thin film transistors, the effect of the hot-carrier injection possibly becomes serious. Therefore, the mobility of the IGZO layer may be decreased.

In view of the above, there exists in this art a need of an improved IGZG thin film transistor that would resolve the drawbacks mentioned above.

SUMMARY

According to one aspect of the present disclosure, a thin film transistor is provided. The thin film transistor includes a substrate, a gate electrode, a gate insulating layer, a source interconnect layer, a drain interconnect layer, a source electrode, a drain electrode and a semiconductor layer. The gate electrode is disposed on the substrate. The gate insulating layer covers the gate electrode and the substrate. Both the source interconnect layer and the drain interconnect layer are disposed on the gate insulating layer, in which the source interconnect layer is spaced apart from the drain interconnect layer. The source electrode and the drain electrode are respectively disposed above and in contact with the source interconnect layer and the drain interconnect layer. The semiconductor layer is disposed above the gate insulating layer at a position overlapped with the gate electrode. The semiconductor layer is in contact with both the source interconnect layer and the drain interconnect layer, but is not in contact with the source electrode and the drain electrode.

According to one embodiment of the present disclosure, the thin film transistor further includes a dielectric layer sandwiched between the source electrode and the gate insulating layer, and between the drain electrode and the gate insulating layer. The source interconnect layer interconnects the source electrode and the semiconductor layer, and the drain interconnect layer interconnects the drain electrode and the semiconductor layer.

According to another aspect of the present disclosure, there is provided a method for manufacturing a thin film transistor. The method includes the steps of providing a substrate; forming a gate electrode on the substrate; forming a gate insulating layer to cover the gate electrode and the substrate; forming a source interconnect layer and a drain interconnect layer on the gate insulating layer, in which the source interconnect layer is spaced apart from the drain interconnect layer; forming a source electrode and a drain electrode respectively in contact with the source interconnect layer and the drain interconnect layer; and forming a semiconductor layer at a position right above the gate electrode, in which the semiconductor layer is in contact with the source interconnect layer and the drain interconnect layer, but the semiconductor layer is not in contact with the source electrode and the drain electrode.

According to one embodiment of the present disclosure, after the step of forming the source interconnect layer and the drain interconnect layer, further includes the step of forming a patterned dielectric layer on the gate insulating layer prior to forming the source electrode and the drain electrode, in which a portion of the source interconnect layer and a portion of the drain interconnect layer are exposed out of the patterned dielectric layer.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
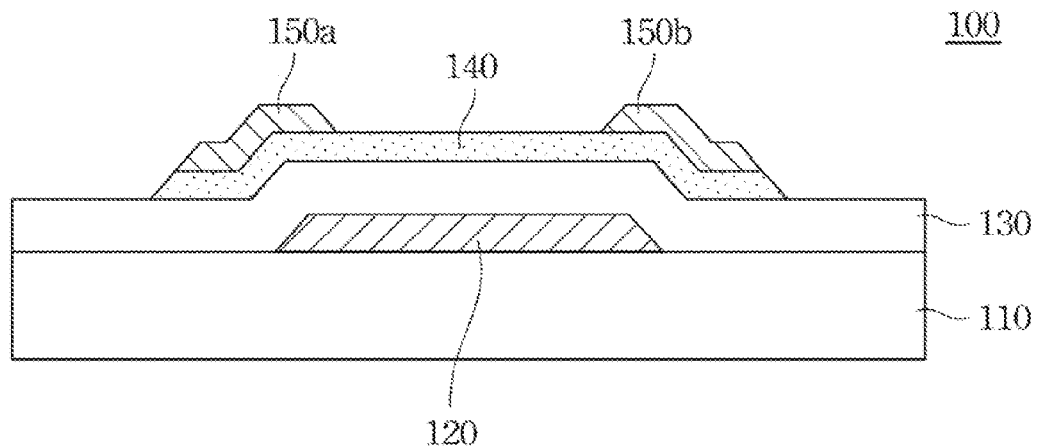
FIG. 1 is a cross-sectional view schematically illustrating a conventional thin film transistor (TFT)

Reference will now be made in detail to the present embodiments of the invention, examples of which are illustrated in the accompanying drawings. Wherever possible, the same reference numbers are used in the drawings and the description to refer to the same or like parts.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

FIG. 1 is a cross-sectional view schematically illustrating a conventional thin film transistor (TFT) 100. With reference to FIG. 1, the conventional TFT 100 comprises a substrate 110, a gate electrode 120, a gate insulating layer 130, indium-gallium-zinc oxide (IGZO) semiconductor layer 140, a source electrode 150a and a drain electrode 150b. It is noted that the IGZO semiconductor layer 140 is in contact with the source electrode 150a and the drain electrode 150b. When dry etching processes are applied in the etching processes of forming the source electrode 150a and the drain electrode 150b, the semiconductor layer 140 is deteriorated by the effect of ion bombardments. As a result, the threshold voltage of the IGZO thin film transistor 100 shifts and leads to a leakage current after the IGZO thin film transistor 100 is driven for a long time period.

Moreover, since the IGZO semiconductor layer 140 is in contact with the source/drain electrodes 150a, 150b, the effect of the hot-carrier injection possibly becomes serious, and therefore the mobility of the IGZO layer may be decreased Accordingly, a novel TFT is provided to resolve the deterioration of the TFT and the decrease in mobility according to one embodiment of the present disclosure.

Figure 2A:
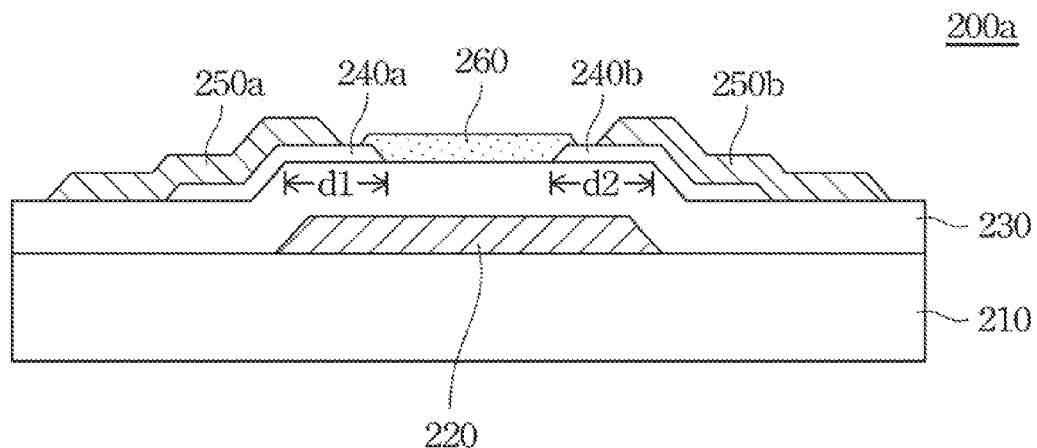
FIG. 2A is a cross-sectional view schematically illustrating a TFT according to one embodiment of the present disclosure.

FIG. 2A is a cross-sectional view schematically illustrating a TFT 200a according to one embodiment of the present disclosure. The TFT 200a depicted in FIG. 2A may be used in liquid crystal display devices or electrophoretic display devices, but is not limited thereto.

With reference to FIG. 2A, the TFT 200a includes a substrate 210, a gate electrode 220, a gate insulating layer 230, a source interconnect layer 240a, a drain interconnect layer 240b, a source electrode 250a, a drain electrode 250b and a semiconductor layer 260. The gate electrode 220 is disposed on the substrate 210. The gate insulating layer 230 covers the gate electrode 220 and the substrate 210. The source interconnect layer 240a and the drain interconnect layer 240b are disposed on the gate insulating layer 230. The source interconnect layer 240a and the drain interconnect layer 240b are spaced apart from each other. The source electrode 250a and a drain electrode 250b are respectively disposed above and in contact with both the source interconnect layer 240a and the drain interconnect layer 240b. For instance, the source/drain electrodes 250a, 250b may be respectively disposed onto the source interconnect layer 240a and the drain interconnect layer 240b. Furthermore, the semiconductor layer 260 is disposed on the gate insulating layer 230 at a position overlapped with the gate electrode 220. The semiconductor layer 260 is in contact with both the source interconnect layer 240a and the drain interconnect layer 240b. The source interconnect layer 240a overlaps the gate electrode 220 by a distance d1 when viewed in a direction perpendicular to a principal surface of the substrate 210. Similarly, the drain interconnect layer 240b overlaps the gate electrode 220 by a distance d2. It is noted that the semiconductor layer 260 is not in contact with the source electrode 250a and the drain electrode 250b.

The semiconductor layer 260 is not directly touched by the source electrode 250a and the drain electrode 250b. The semiconductor layer 260 may be electrically connected to the source electrode 250a and the drain electrode 250b respectively through the source interconnect layer 240a and the drain interconnect layer 240b. In one example, the semiconductor layer 260 comprises IGZO.

In the prior art, the IGZO layer directly touches the source/drain electrodes. It is discovered that the mobility of the IGZO layer is decreased when the IGZO layer directly touches the source/drain electrodes, possibly because the hot-carrier injection becomes apt to occur.

Based on this discovery, the semiconductor layer 260 is not in contact with the source electrode 250a and the drain electrode 250b according to the embodiments of the present disclosure. The source interconnect layer 240a and drain interconnect layer 240b are used to interconnects the semiconductor layer 260 with the source/drain electrodes 250a, 250b, so that the mobility of semiconductor layer 260 may be increased. In particular, metal or conductive metal-oxide materials may be utilized to form the source interconnect layer 240a and the drain interconnect layer 240b according to the embodiments of the present disclosure. Suitable conductive metal-oxide materials include, but are not limited to, indium tin oxide, aluminum zinc oxide, indium zinc oxide and zinc oxide. In one specific example, both the source interconnect layer 240a and the drain interconnect layer 240b consists essentially of one of indium tin oxide, aluminum zinc oxide, indium zinc oxide and zinc oxide. In another example, the oxygen atomic percentage in the material of the source interconnect layer 240a and/or the drain interconnect layer 240 may be greater than that of the source/drain electrodes 250a, 250b, which are usually made of metallic material.

In one example, the source interconnect layer 240a and/or the drain interconnect layer 240b may be made of a material that has a relatively high conductivity, as compared with the semiconductor layer 260. For instance, the source interconnect layer 240a and drain interconnect layer 240b may be made of indium tin oxide (ITO). The conductivity of ITO is greater than the material of the semiconductor layer 260 such as IGZO. In this way, the mobility of semiconductor layer 260 may be improved since the hot-carrier injection is suppressed.

In one example, the gate insulating layer 230 may be made of a material such as silicon nitride, silicon oxide, polyimide, polysiloxane and a combination thereof.

In another example, the source electrode 250a and the drain electrode 250b are made of a metal or a metal alloy such as a molybdenum-chromiu alloy, for example.

In one example, semiconductor layer 260 is a metal-oxide semiconductor layer. For instance, the metal-oxide semiconductor layer may comprise indium-gallium-zinc oxide (IGZO).

In examples, the overlapping distance d1 between the source interconnect layer 240a and the gate electrode 220 is equal to or less than 1 μm. The overlapping distance d2 between the drain interconnect layer 240b and the gate electrode 220 is equal to or less than 1 μm.

Figure 2B:
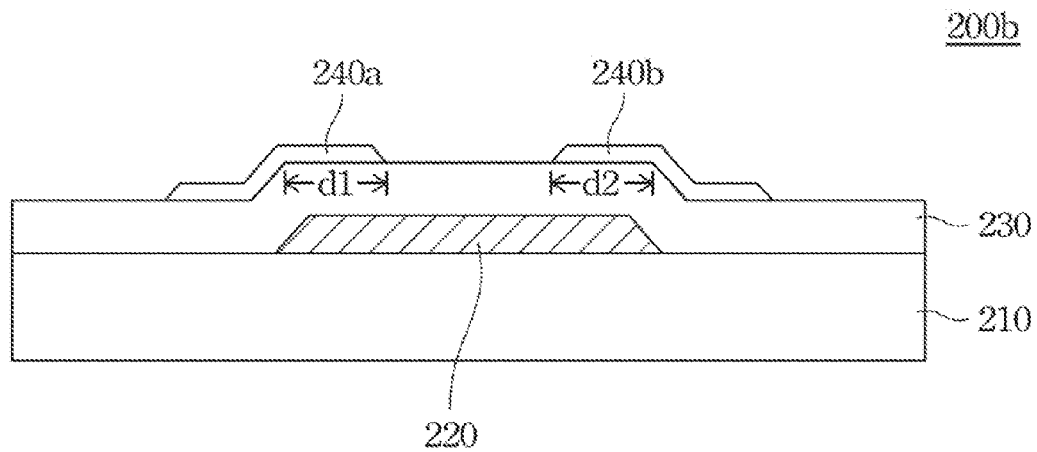
FIG. 2B is a cross-sectional view schematically illustrating a process step of he method according to one embodiment of the present disclosure.

According to another aspect of the present disclosure, a method for forming a TFT is provided. FIG. 2B is a cross-sectional view illustrating a process step of the method according to one embodiment of the present disclosure.

The method includes the steps described below. With reference to FIG. 2B, a gate electrode 220 is formed on a substrate 210. Subsequently, a gate insulating layer 230 is formed to cover the gate electrode 220 and the substrate 210. A source interconnect layer 240a and a drain interconnect layer 240b are formed on the gate insulating layer 230, in which the source interconnect layer 240a is spaced apart from the drain interconnect layer 240b. The source interconnect layer 240a and the drain interconnect layer 240b may be made a material described hereinbefore.

Thereafter, with reference to FIG. 2A, a source electrode 250a and a drain electrode 250b are formed respectively above the source interconnect layer 240a and the drain interconnect layer 240b. The source electrode 250a and a drain electrode 250b are respectively in contact with the source interconnect layer 240a and the drain interconnect layer 240b. Furthermore, a semiconductor layer 260 is formed at a position right above the gate electrode 220. The semiconductor layer 260 is in contact with both the source interconnect layer 240a and the drain interconnect layer 240b. In one example, the semiconductor layer 260 is formed after the source electrode 250a and the drain electrode 250b are formed. In another example, the semiconductor layer 260 may be formed before the formation of the source electrode 250a and the drain electrode 250b.

In one example, the step of forming the semiconductor layer comprises steps of depositing a metal-oxide semiconductor layer on the gate insulating layer, and etching the metal-oxide semiconductor layer to form the semiconductor layer. The metal-oxide semiconductor layer may be etched by using a wet etching process, a dry etching process or a combination thereof. When a wet etching process is employed, an etchant including phosphoric acid, acetic acid, nitric acid or a combination thereof may be used. For example, a PAN (Phosphoric-Acetic-Nitric) etchant may be used.

In the conventional TFT 100 as depicted in FIG. 1, when dry etching processes are applied in the etching processes of forming the source and the drain electrodes 150a, 150b, the semiconductor layer 140 is deteriorated by the ion bombardments, and thus the reliability of the TFT is poor. On the other hand, when wet etching processes are employed in the etching processes of forming the source and drain electrodes 150a, 150b, the pattern of the IGZO semiconductor layer 140 is difficult to be well controlled because most of wet etchants exhibit a low etching selectivity between the IGZO semiconductor layer and the metallic source/drain electrodes.

According to one embodiment of the present disclosure, the source/drain electrode 250a, 250b are not formed onto the semiconductor layer 260 so that the source/drain electrodes 250a, 250b may be formed prior to the fabrication of the semiconductor layer 260. Accordingly, when the source/drain electrodes 250a, 250b are patterned by using a dry etching process, the semiconductor layer 260 is not damaged by the ion bombardments of the dry etching process, and thereby the reliability of the TFT 200a may be improved. On the other hand, when a wet etching process is employed to form the source/drain electrodes 250a, 250b, the semiconductor layer 260 is not damaged by the etchant of the wet etching processes.

According to one embodiment of the present disclosure, when the semiconductor layer is made of indium-gallium-zinc oxide (IGZO), the source/drain electrodes are patterned by a two-step etching approach, which includes a wet etching process and a dry etching process. Firstly, the wet etching process is performed to remove most material of the source/drain electrodes, in which the etchant solution is a phosphoric-acetic-nitric (PAN) acid that includes phosphoric acid, acetic acid, nitric acid or a combination thereof. In the etching process using PAN acid as an etchant, the etching rate of the IGZO semiconductor layer is greater than that of the source/drain electrodes (i.e the etching rate of the IGZO semiconductor layer is about 20 nm/sec), and therefore the thickness difference between the IGZO semiconductor layer and each of the source/drain electrodes is undesirably enlarged. Subsequently, the dry etching process is performed to remove the remained material of the source/drain electrodes so that the thickness difference between the IGZO semiconductor layer and each of the source/drain electrodes may be reduced. The method described above is an exemplified example, and the present disclosure is not limited thereto.

Figure 3A:
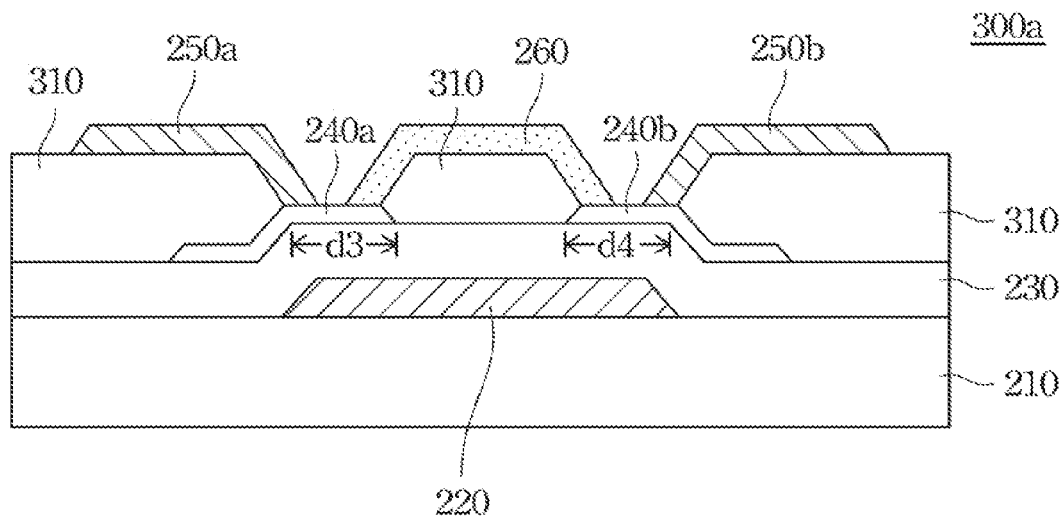
FIG. 3A is a cross-sectional view schematically illustrating a TFT according to another embodiment of the present disclosure.

FIG. 3A is a cross-sectional view schematically illustrating a thin film transistor 300a according to another embodiment of the present disclosure. The TFT 300a may be used in liquid crystal display devices or electrophoretic display devices, but is not limited thereto.

With reference to FIG. 3A, the TFT 300a includes a substrate 210, a gate electrode 220, a gate insulating layer 230, a source interconnect layer 240a, a drain interconnect layer 240b, a dielectric layer 310, a source electrode 250a, a drain electrode 250b and a semiconductor layer 260.

The TFT 300a depicted in FIG. 3A is similar to the TFT 200a in FIG. 2A in structure. The TFT 300a is merely different from the TFT 200a in that the TFT 300a further includes a dielectric layer 310. In one example, the dielectric layer 310 may be positioned between the semiconductor layer 260 and the gate insulating layer 230. In another example, the dielectric layer 310 may further be positioned between the source electrode 250a and the gate insulating layer 230, and between the drain electrode 250b and the gate insulating layer 230. In one specific example, the dielectric layer 310 supports the semiconductor layer 260 to a relatively higher position such that a distance between the semiconductor layer 260 and the gate electrode 220 is greater than a distance between the source interconnect layer 240a (or the drain interconnect layer 240b) and the gate electrode 220. In another example, the dielectric layer 310 is a patterned dielectric layer that has two openings respectively expose the source interconnect layer 240a and the drain interconnect layer 240b. The source interconnect layer 240a and the drain interconnect layer 240b are in contact with the semiconductor layer 260 respectively through the two openings. It is noted that the semiconductor layer 260 is not in contact with the source electrode 250a and the drain electrode 250b.

In one example, the dielectric layer 310 may be made of silicon nitride, silicon oxide, polyimide, polysiloxane or a combination thereof.

In another example, the source interconnect layer 240a overlaps the gate electrode 220 by a distance d3, and the drain interconnect layer 240b overlaps the gate electrode 220 by a distance d4. The distance d3 and/or the distance d4 may be equal to or less than 1 μm.

Figure 3B:
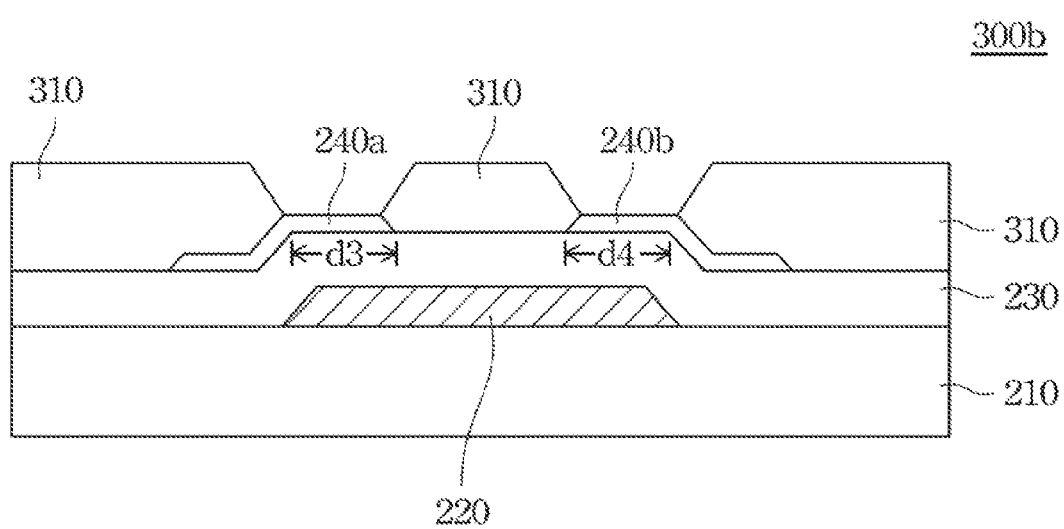
FIG. 3B is a cross-sectional view illustrating a process step of a method for fabricating a TFT according to another embodiment of the present disclosure.

FIG. 3B is a cross-sectional view illustrating a process step of a method for fabricating the TFT 300a according to another embodiment of the present disclosure. The method for fabricating the TFT 300a may be the same as those described above in connection with FIG. 2A and FIG. 2B, excepts that a patterned dielectric layer 310 is formed on the gate insulating layer 230 prior to forming the source electrode 250a and the drain electrode 250b.

Specifically, after completing the structure 200b depicted in FIG. 2B, a patterned dielectric layer 310 is formed on the source interconnect layer 240a, the drain interconnect layer 240b and the gate insulating layer 230, as depicted in FIG. 3B. A portion of the source interconnect layer 240a and a portion of the drain interconnect layer 240b are exposed out of the patterned dielectric layer 310.

After forming the structure 300b depicted in FIG. 3B, a source electrode 250a and a drain electrode 250b are formed on the patterned dielectric layer 310 as depicted in FIG. 3A. The source/drain electrodes 250a, 250b are respectively in contact with the source interconnect layer 240a and the drain interconnect layer 240b. Sequentially, a semiconductor layer 260 is formed on the patterned dielectric layer 310 at a position right above the gate electrode 220. The semiconductor layer 260 is in contact with both the source interconnect layer 240a and the drain interconnect layer 240b. However, the semiconductor layer 260 is not in contact with the source electrode 250a and the drain electrode 250b. The semiconductor layer 260 is electrically connected the source electrode 250a and the drain electrode 250b respectively through the source interconnect layer 240a and the drain interconnect layer 240b.

In one example, the step of forming the semiconductor layer comprises depositing a metal-oxide semiconductor layer on the patterned dielectric layer, and etching the metal-oxide semiconductor layer to form the semiconductor layer.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A thin film transistor, comprising:
a substrate having a principal surface;
a gate electrode disposed on the principal surface of the substrate;
a gate insulating layer covering the gate electrode and the substrate;
a source interconnect layer and a drain interconnect layer disposed on the gate insulating layer, wherein the source interconnect layer is spaced apart from the drain interconnect layer by a gap;
a source electrode and a drain electrode respectively disposed above and in contact with the source interconnect layer and the drain interconnect layer; and
a semiconductor layer disposed above the gate insulating layer at a position overlapped with the gate electrode, wherein the semiconductor layer is in contact with both the source interconnect layer and the drain interconnect layer, and filled in the gap between the source interconnect layer and the drain interconnect layer, wherein an edge of the source interconnect layer and an edge of the drain interconnect layer are interposed between the semiconductor layer and the gate insulating layer, wherein the semiconductor layer is not overlapped with the source electrode and the drain electrode when observed in a direction perpendicular to the principal surface of the substrate, and the source electrode and the drain electrode are spaced apart from the semiconductor layer by clearances through which portions of the source interconnect layer and the drain interconnect layer are exposed.

2. The thin film transistor according to claim 1, wherein the gate insulating layer comprises at least one material selected from the group consisting of silicon nitride, silicon oxide, polyimide and polysiloxane.

3. The thin film transistor according to claim 1, wherein both the source interconnect layer and the drain interconnect layer comprise a conductive metal-oxide material or a metal.

4. The thin film transistor according to claim 3, wherein the conductive metal-oxide material comprises at least one of indium tin oxide, aluminum zinc oxide, indium zinc oxide and zinc oxide.

5. The thin film transistor according to claim 1, wherein the semiconductor layer is a metal-oxide semiconductor layer.

6. The thin film transistor according to claim 5, wherein the metal-oxide semiconductor layer comprises indium-gallium-zinc oxide (IGZO).

7. The thin film transistor according to claim 1, wherein both the source electrode and the drain electrode are made of a metal or a metal alloy.

8. The thin film transistor according to claim 7, wherein the metal alloy comprises a molybdenum-chromium alloy.

9. The thin film transistor according to claim 1, each of the source interconnect layer and the drain interconnect layer overlaps the gate electrode by a distance.

10. The thin film transistor according to claim 9, wherein the distance is equal to or less than 1 μm.

11. A method for manufacturing a thin film transistor, comprising:
providing a substrate having a principal surface;
forming a gate electrode on the principal surface of the substrate;
forming a gate insulating layer to cover the gate electrode and the substrate;
forming a source interconnect layer and a drain interconnect layer on the gate insulating layer, wherein the source interconnect layer is space apart from the drain interconnect layer;
forming a source electrode and a drain electrode respectively in contact with the source interconnect layer and the drain interconnect layer; and
after the step of forming the source interconnect layer and the drain interconnect layer, forming a semiconductor layer at a position right above the gate electrode to cover and contact with an edge of the source interconnect layer and an edge of the drain interconnect layer, wherein the semiconductor layer is not overlapped with the source electrode and the drain electrode when observed in a direction perpendicular to the principal surface of the substrate, and the source electrode and the drain electrode are spaced apart from the semiconductor layer by clearances through which portions of the source interconnect layer and the drain interconnect layer are exposed.

12. The method according to claim 11, after the step of forming the source interconnect layer and the drain interconnect layer, further comprising:
forming a patterned dielectric layer on the gate insulating layer prior to forming the source electrode and the drain electrode, wherein a portion of the source interconnect layer and a portion of the drain interconnect layer are exposed out of the patterned dielectric layer.

13. The method according to claim 12, wherein the step of forming the semiconductor layer comprises:
depositing a metal-oxide semiconductor layer on the patterned dielectric layer; and
etching the metal-oxide semiconductor layer to form the semiconductor layer.

14. The method according to claim 11, wherein the step of forming the semiconductor layer comprises:
depositing a metal-oxide semiconductor layer on the gate insulating layer; and
etching the metal-oxide semiconductor layer to form the semiconductor layer.

15. The method according to claim 14, wherein the step of etching the metal-oxide semiconductor layer comprises applying a wet etching process, a dry etching process or a combination thereof.

16. The method according to claim 14, wherein the step of etching the metal-oxide semiconductor layer comprises applying a wet etching process using an etchant including phosphoric acid, acetic acid, nitric acid or a combination thereof.

17. The method according to claim 11, wherein the source interconnect layer and the drain interconnect layer comprises a conductive metal-oxide material selected from the group consisting of indium tin oxide, aluminum zinc oxide, indium zinc oxide, zinc oxide and a combination thereof.

18. A thin film transistor, comprising:
a substrate;
a gate electrode disposed on the substrate;
a gate insulating layer covering the gate electrode and the substrate;
a source interconnect layer and a drain interconnect layer disposed on the gate insulating layer, wherein the source interconnect layer is spaced apart from the drain interconnect layer;
a dielectric layer disposed on the source interconnect layer, the drain interconnect layer, and the gate insulating layer, wherein the dielectric layer has a first opening and a second opening respectively exposing the source interconnect layer and the drain interconnect layer;
a semiconductor layer disposed on the dielectric layer at a position over the gate electrode, the semiconductor layer having two edges respectively positioned in the first opening and the second opening, so as to connect to and in contact with the source interconnect layer and the drain interconnect layer;
a source electrode disposed on the dielectric layer and having an edge positioned in the first opening and in contact with the source interconnect layer; and
a drain electrode disposed on the dielectric layer and having an edge positioned in the second opening and in contact with the drain interconnect layer;
wherein the source electrode and the drain electrode are not in contact with the semiconductor layer.

* * * * *